United States Patent
Sakai et al.

(10) Patent No.: US 6,839,006 B1
(45) Date of Patent: Jan. 4, 2005

(54) COMMUNICATION DEVICE

(75) Inventors: Takahisa Sakai, Amagasaki (JP); Yuji Mizuguchi, Hirakata (JP); Toshitomo Umei, Settsu (JP); Noboru Katta, Itami (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/771,062

(22) Filed: Feb. 4, 2004

(30) Foreign Application Priority Data

Dec. 10, 2003 (JP) .................................. 2003-412369

(51) Int. Cl.$^7$ .............................................. H03M 7/12

(52) U.S. Cl. ........................................ 341/70; 341/100

(58) Field of Search ............................ 341/50, 51, 53, 341/70, 100, 105; 375/130, 136, 150, 152, 282, 333, 361

(56) References Cited

U.S. PATENT DOCUMENTS

| | | | | |
|---|---|---|---|---|
| 4,992,790 A | * | 2/1991 | Montgomery | 341/70 |
| 5,862,005 A | * | 1/1999 | Leis et al. | 360/27 |
| 6,278,864 B1 | * | 8/2001 | Cummins et al. | 455/73 |
| 6,363,107 B1 | * | 3/2002 | Scott | 375/150 |
| 6,768,433 B1 | * | 7/2004 | Toth et al. | 341/105 |

FOREIGN PATENT DOCUMENTS

WO 02/30075 4/2002

* cited by examiner

Primary Examiner—Michael Tokar
Assistant Examiner—Linh V Nguyen
(74) Attorney, Agent, or Firm—Wenderoth, Lind & Ponack, L.L.P.

(57) ABSTRACT

An S/P converter 120 converts input data from serial to parallel for every two bits in different timings, thereby outputting two types of parallel data. Based on the input data, a timing detector 130 detects a timing which corresponds to boundaries between bits of a data portion before biphase encoding. Based on the detection result of the timing detector, a selector 140 selects either one of the two types of parallel data output from the S/P converter 120.

15 Claims, 16 Drawing Sheets

FIG. 7

| | WHEN THE PREVIOUS CODE IS 0 | WHEN THE PREVIOUS CODE IS 1 |
|---|---|---|
| B HEADER | 11101000 | 00010111 |
| M HEADER | 11100010 | 00011101 |
| W HEADER | 11100100 | 00011011 |

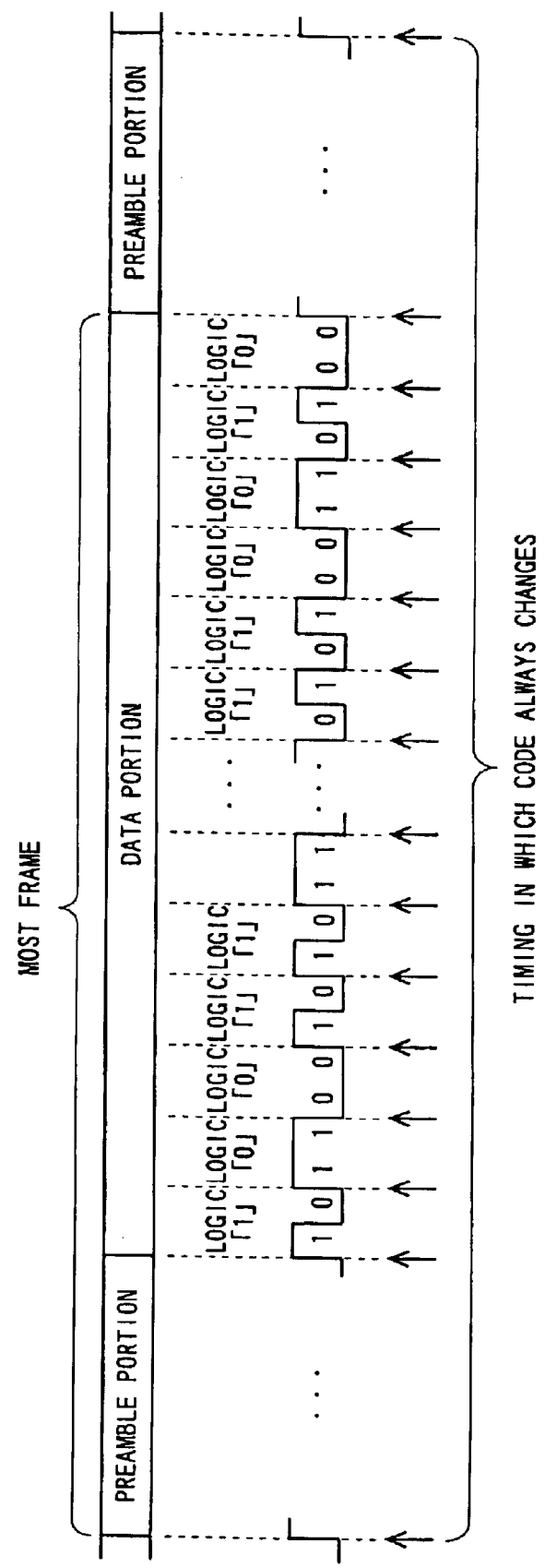
F I G. 8

COMMUNICATION DEVICE

BACKGROUND OF THE INVENTION

1. Field of the Invention

The present invention relates to communication devices and, more specifically, to a communication device for transmitting input data including at least a biphase-encoded portion with the use of an analog signal.

2. Description of the Background Art

Conventionally, in order to transfer digital audio data between two devices, biphase encoding has been generally used. One example of biphase encoding is defined in a format of Sony/Philips Digital Interface (S/PDIF). In biphase encoding, as illustrated in FIG. 6, each bit of original data is represented by two logical values. After biphase encoding, a logical value of '1' of the original data represents a state transition (0 to 1 or 1 to 0, for example) occurring at the midpoint of one bit period while a logical value of "0" thereof represents the absence of a state transition (0 to 0 or 1 to 1, for example) occurring at the midpoint. Furthermore, at the boundary between bits of the original data, the logical value is always reversed (that is, after biphase encoding, the logical value becomes 1 if the previous value is 0, and 0 if 1).

As such, biphase encoding always changes the logical value at the boundaries between the bits of the original data. Therefore, even in a case where the original data has successive 0s or 1s, the receiving device can easily reproduce a clock signal from the transfer data without requiring transmission of any additional clock signal.

In general, the data transferred between the devices includes the audio data which is biphase-encoded in the above-described manner and is added with a preamble of 8 bits (which corresponds to 4 bits of the original data before biphase encoding) for establishing synchronization of this audio data. Biphase encoding is not applied to the preamble, and the bit string of the preamble includes three or more successive 01s or 1s. By contrast, as described above, the biphase-encoded data never includes such three or more successive 0s or 1s because the logic value is always reversed at the boundaries between the bits of the original data. Therefore, by determining whether three successive 0s or 1s have been received, the receiving device can easily discriminate the audio data portion from the preamble portion. A plurality of preamble patterns are provided in advance, such as one indicative of the head of a block (B preamble), one indicative of the head of a sub-frame of the R channel (M preamble), and one indicative of the head of a sub-frame of the L channel (W preamble). FIG. 7 illustrates header patterns (B header, M header, and W header) used in S/PDIF. Since the code is always reversed at the boundary between the header portion and the data portion in an S/PDIF frame, each header has two patterns in accordance with the previous code.

One example of a communication protocol that has been used in recent years for achieving data transfer between vehicle-mounted devices through an on-board LAN is Media Oriented Systems Transport (MOST). In MOST, as illustrated in FIG. 8, data is transferred in units of frames (MOST frames), and the above-described biphase encoding is applied to the data portion.

S/PDIF and MOST are communication protocols optimized for data transmission by using a plastic optical fiber (POF), but a copper wire, such as a twisted pair cable or a coaxial cable, can also be used as a transmission medium. One advantage of using such a copper wire is easy handling.

Even having an advantage of not requiring transfer of a clock signal, however, data transfer using biphase encoding has a disadvantage of an increased transmission band in order to achieve a certain data transfer speed. For example, in MOST, in order to achieve an effective transfer speed of 25 Mbps, a data transfer speed of 50 Mbps is required. Therefore, if biphase-encoded transmission data output from a vehicle-mounted device is sent out as it is to the copper wire, an influence of electromagnetic radiation from the copper wire cannot be ignored even if the twisted pair cable, which less likely has an external influence, is used as the transmission medium.

One scheme to solve the above problems is to map the transmission data which is structured of biphase-encoded data at predetermined signal levels so that two bits of the transmission data is taken as one symbol for transmission (refer to International Publication No. 02/30075, for example).

FIG. 10 illustrates one example of a communication system using the above-mentioned scheme. In FIG. 10, input data (biphase-encoded serial data) 102 structured of frames is first supplied to a transmitting unit 10 of one device. This input data is converted from serial to parallel by an S/P converter 104 to become parallel data of two bits. An encoder 106 maps the data of two bits sequentially output from the S/P converter 104 at the predetermined signal levels so that the data of two bits are taken as one symbol.

The operation of the encoder 106 is described below with reference to FIGS. 11 through 13.

As illustrated in FIG. 11, the encoder 106 of the transmitting unit 10 in the device maps the data of two bits sequentially output from an S/P converter 104 at any one of eight signal levels so that the polarity is changed per symbol. The signal level at which the data of two bits is to be mapped depends on the immediately-preceding mapping result. In one specific example, the signal level at which the transmission data is to be mapped is determined with reference to a table shown in FIG. 12 based on the signal level of the immediately-preceding symbol and the transmission data to be mapped. Consequently, the processing results of the encoder 106 areas illustrated in FIG. 13, for example.

The processing results of the encoder 106 are supplied via a digital filter 108 to a D/A converter 110, which converts them to an analog signal. This analog signal is output via a low-pass filter 112 and a differential driver 114 to a twisted pair cable 20.

The analog signal transmitted via the twisted pair cable is supplied via a differential receiver 304 included in a receiving unit 30 of another device to an A/D converter 306. Based on the output of the A/D converter 306, a synchronization processing unit 308 regenerates clock signals. An output of the A/D converter 306 is supplied via a digital filter 310 to a decision processing unit 312. The decision processing unit 312 decides one of predetermined signal level as the signal level at which the output of the A/D converter 306 was assigned. Based on the decision result, the encoder 314 outputs serial data. This serial data is identical to the input data 102.

In this way, every two bits of the input data 102 are mapped as one symbol at one of the predetermined signal levels for transmission. With this, compared with a case where one bit is transmitted as one symbol, the symbol rate can be suppressed by half, thereby reducing electromagnetic radiation. Furthermore, as illustrated in FIG. 11, with this mapping being performed so that the polarity of the signal level is always reversed per symbol, the transmission signal always includes a frequency component which is half of a symbol frequency. Therefore, more reliable clock regeneration can be achieved at the receiving device.

However, studies by the inventors of the present invention found that the above conventional communication system has a disadvantage such that the degree of emission noise can be differed depending on the timing of serial-parallel conversion, which is described below.

As illustrated in FIG. 14, there are two types of timing for serial-parallel conversion of biphase-encoded data. That is, a first timing corresponds to boundaries between bits of data before biphase-encoding, whereas a second timing does not. In the communication system illustrated in FIG. 10, it is not determined in which timing the S/P converter 104 performs serial-parallel conversion, and therefore a probability of conversion in the first timing and a probability of conversion in the second timing are both ½.

Here, in FIG. 14, two bits of parallel data obtained through serial-parallel conversion in the first timing are one of four pairs of "00", "01", "10", and "11". When such parallel data is mapped in accordance with the rules shown in FIG. 12, the transmission waveform can be at one of the eight signal levels as illustrated in FIG. 15.

On the other hand, in FIG. 14, two bits of parallel data obtained through serial-parallel conversion in the second timing are either one of two pairs of "01" and "10", because of the characteristics of biphase encoding. When such parallel data is mapped in accordance with the rules shown in FIG. 12, the transmission waveform becomes as illustrated in FIG. 16A or FIG. 16B, depending on the state.

Here, compared with the transmission waveforms illustrated in FIGS. 15 and 16A, the transmission waveform illustrated in FIG. 16B has a higher possibility such that the signal level is changed from +7 to −7 (or from −7 to +7). When the signal level is alternately changed between +7 and −7, noise from the twisted pair cable becomes maximum. Therefore, the transmission waveform as illustrated in FIG. 16B is not preferable compared with the transmission waveforms as illustrated in FIGS. 15 and 16A. Particularly, when data before biphase encoding has successive 0s, the parallel data obtained through serial-parallel conversion in the second timing has "01" and "10" that are alternately repeated and, when such parallel data is mapped in accordance with the rules shown in FIG. 12, the signal level is changed alternately between +7 and −7, which is not preferable as described above.

SUMMARY OF THE INVENTION

Therefore, an object of the present invention is to provide a communication device capable of reducing the occurrence of alternately repeating the maximum signal level and the minimum signal level.

The present invention adopts the following structure to solve the problems mentioned above.

A communication device of the present invention includes: an S/P converter for converting the input data from serial data to parallel data for every two bits in different timings and outputting two types of parallel data; a timing detector for detecting, based on the input data, a timing which corresponds to a boundary between bits of the data portion before biphase encoding; a selector for selecting, based on the detection result of the timing detector, one of the two types of parallel data output from the S/P converter; a mapping unit for sequentially mapping every two bits of the parallel data selected by the selector at any one of a plurality of signal levels; and a D/A converter for outputting an analog signal based on the mapping result of the mapping unit.

Alternatively, the S/P converter may convert the input data to parallel data based on the detection result detected by the timing detector.

Still alternatively, the input data may have a header portion inserted therein, and the timing detector may detect the timing by detecting the header portion in the input data.

Still alternatively, the timing detector may detect the timing by detecting a portion of two successive identical codes in the input data.

Still alternatively, of the two types of parallel data output from the S/P converter, the selector may select parallel data obtained through serial-parallel conversion in the timing which corresponds to the boundary between the bits of the data portion before biphase encoding.

Still alternatively, the input data may be structured of MOST frames.

According to the present invention, the selector selects a timing for serial-parallel conversion based on the detection result of the timing detector, thereby restricting the amount of noise.

Especially, when the timing which corresponds to the boundaries between the bits of the data portion before biphase encoding is selected from the two timings, the range of values the signal level can take is widened. This offers an additional effect of reducing the possibility that the signal level is alternately changed between the maximum level and the minimum level.

These and other objects, features, aspects and advantages of the present invention will become more apparent from the following detailed description of the present invention when taken in conjunction with the accompanying drawings.

BRIEF DESCRIPTION OF THE DRAWING

FIG. 7 is an illustration for describing patterns of a header portion of an S/PDIF frame;

FIG. 8 is an illustration showing the structure of a MOST frame;

DESCRIPTION OF THE PREFERRED EMBODIMENT

Figure 1:
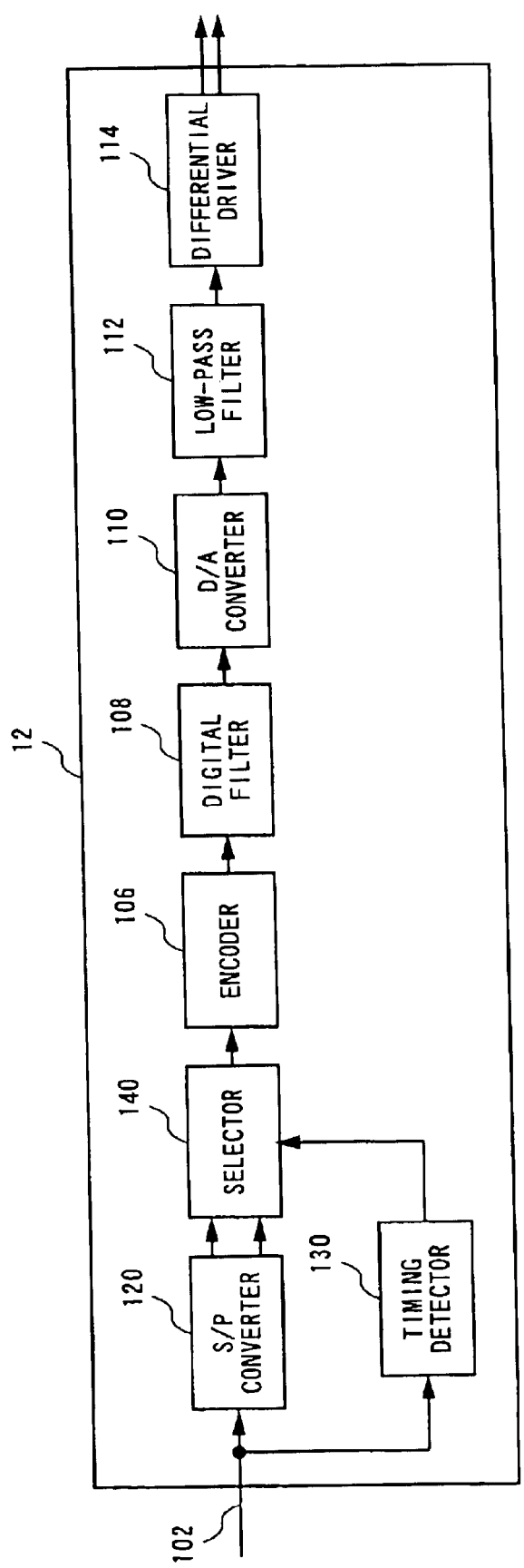
FIG. 1 is a block diagram illustrating the structure of a communication device according to one embodiment of the present invention.

One embodiment of the present invention is described below. In FIG. 1, a communication device 12 of the present embodiment includes an S/P converter 120, a timing detector 130, a selector 140, an encoder 106, a digital filter 108, a D/A converter 110, a low-pass filter 112, and a differential driver 114. Note that components in FIG. 1 that are similar in structure to those in the communication system illustrated in FIG. 10 are provided with the same reference numerals, and are not described herein.

Figure 10:
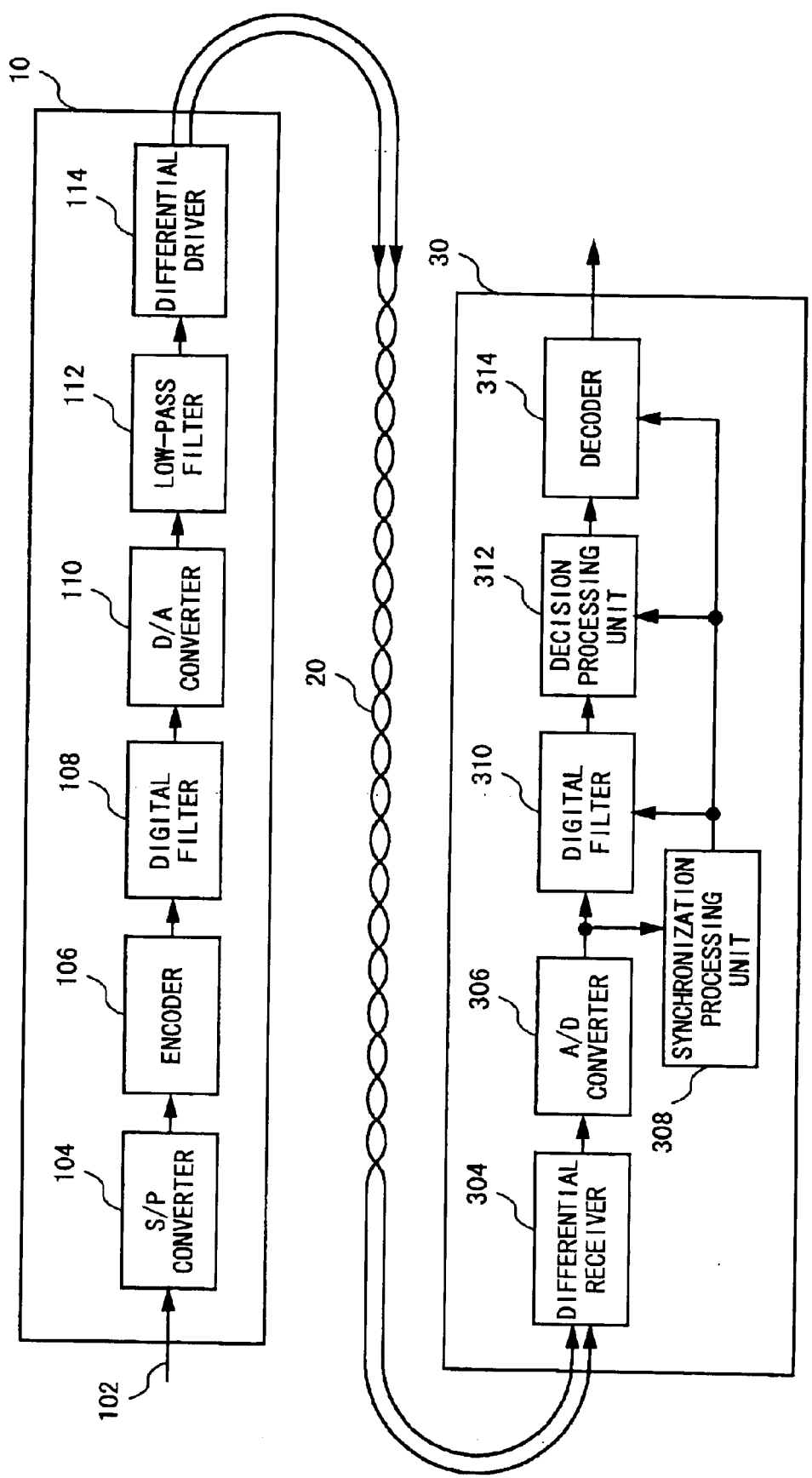
FIG. 10 is a block diagram illustrating the configuration of a conventional communication system.
Figure 11:
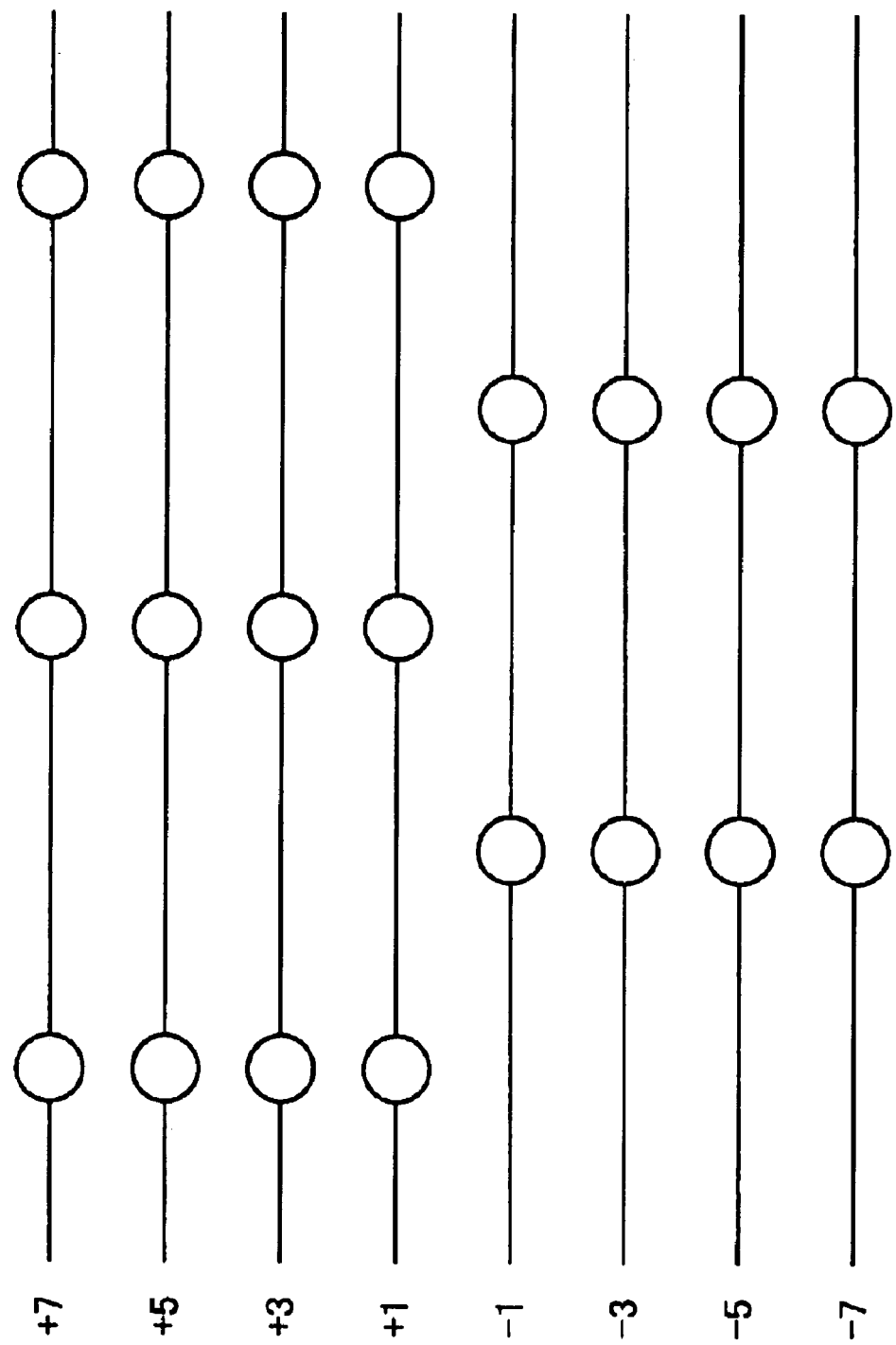
FIG. 11 is an illustration for describing a mapping operation performed by an encoder in the conventional communication system.

As with FIG. 10, the communication device 12 is supplied with input data (biphase-encoded serial data) structured of S/PDIF frames. The S/P converter 120 converts this serial data from serial to parallel for every two bits in different timings, thereby outputting two types of parallel data.

Figure 2:
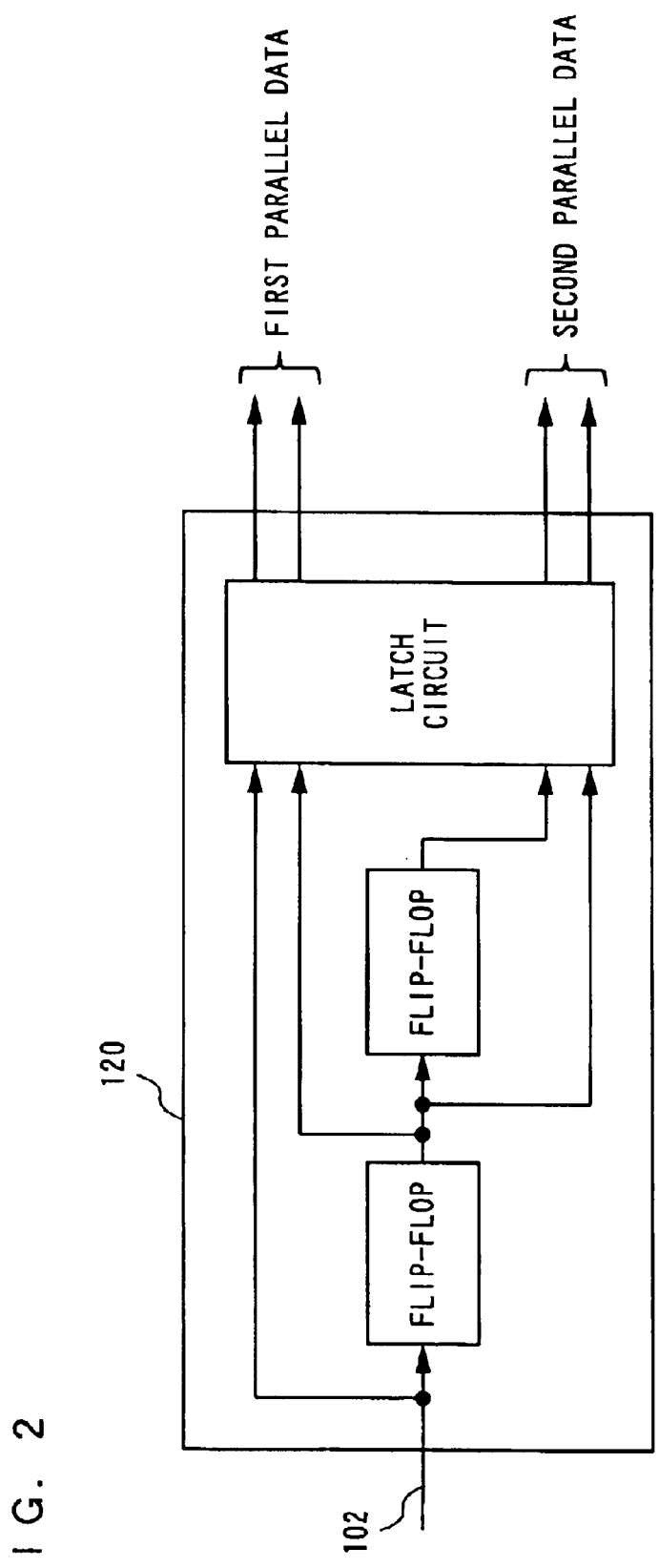
FIG. 2 is a block diagram illustrating the structure of an S/P converter.

FIG. 2 illustrates the structure of the S/P converter 120. The S/P converter 120 includes two flip-flop circuits and a latch circuit for outputting two types of parallel data (first parallel data and second parallel data) converted from serial to parallel for every two bits in different timings. The structure of the S/P converter 120 is not limited to that illustrated in FIG. 2, and another arbitrary structure having similar functions can be adopted.

Figure 3:
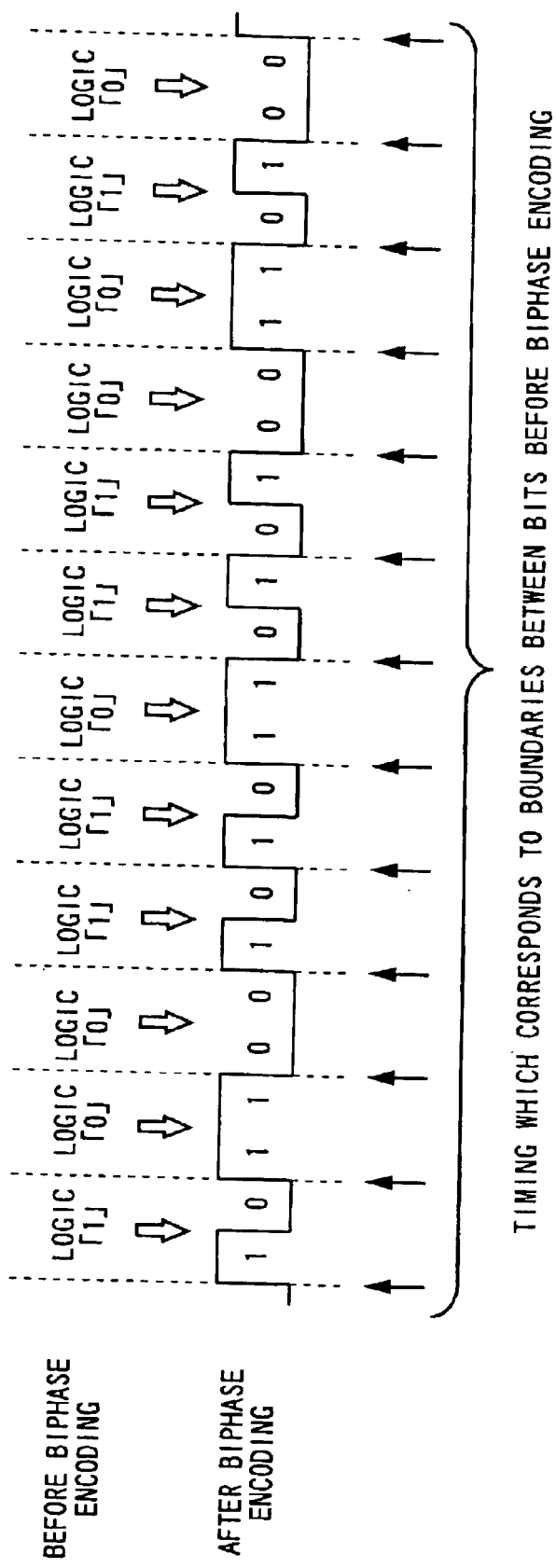
FIG. 3 is an illustration showing a timing which corresponds to boundaries between bits before biphase encoding.

The timing detector 130 detects a timing which corresponds to the boundaries between bits of the data portion before biphase encoding. Specifically, the timing is denoted by black arrows in FIG. 3. There are various schemes for the timing detector 130 to detect these timings. One scheme is to detect a header portion, whereas another scheme is to detect a portion of two successive identical codes. These two schemes are more specifically described below.

Figure 4:
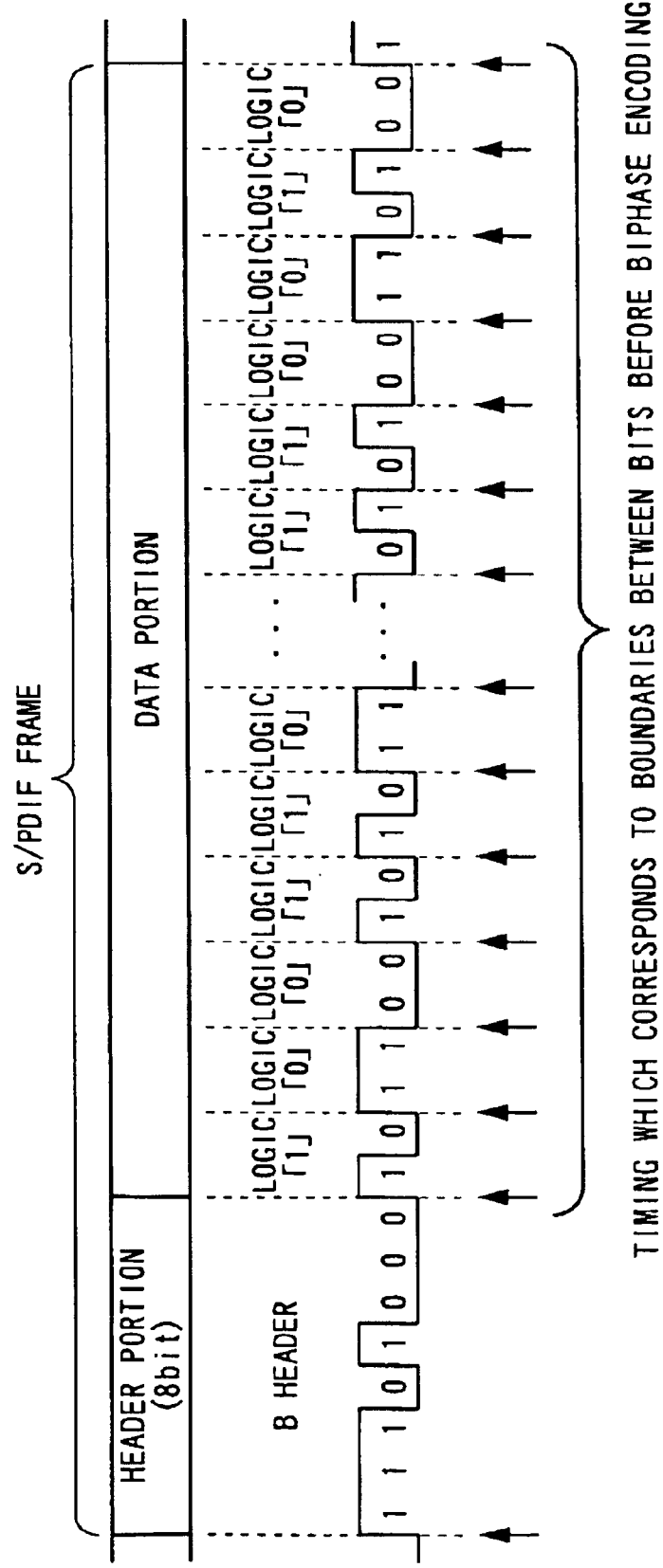
FIG. 4 is an illustration for describing that the timing which corresponds to the boundaries between the bits before biphase encoding can be detected by detecting a header portion.

As illustrated in FIG. 4, each S/PDIF frame has a header portion being inserted at a predetermined position. Therefore, in one scheme, by detecting the header portion from the input data 102, the boundary between the header portion and the data portion, for example, can be detected. This boundary corresponds to the boundary between the bits before biphase encoding. Thus, by detecting the header portions from the input data 102, the timing detector 130 can easily detect the timing which corresponds to the boundaries between the bits of the data portion before biphase encoding.

Figure 5:
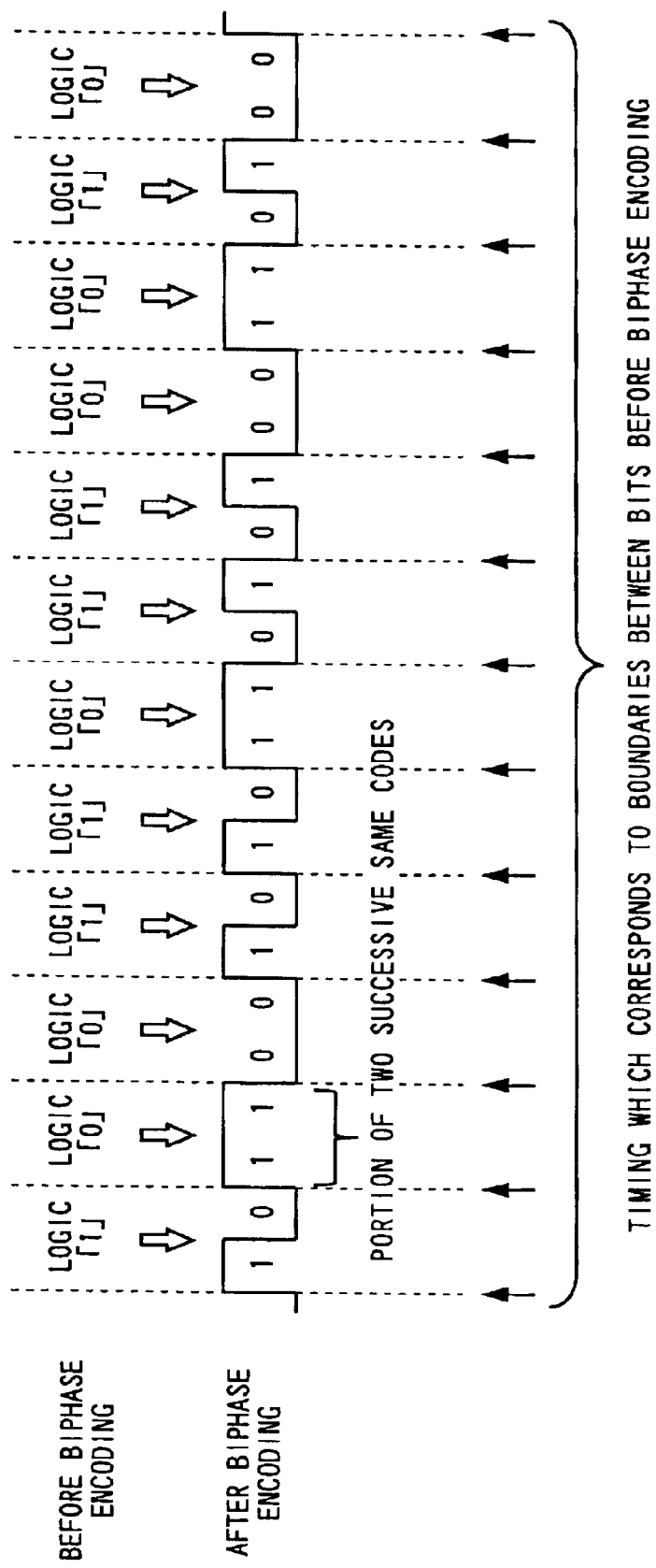
FIG. 5 is an illustration for describing that the timing which corresponds to the boundaries between the bits before biphase encoding can be detected by detecting a portion of two successive identical codes.
Figure 6:
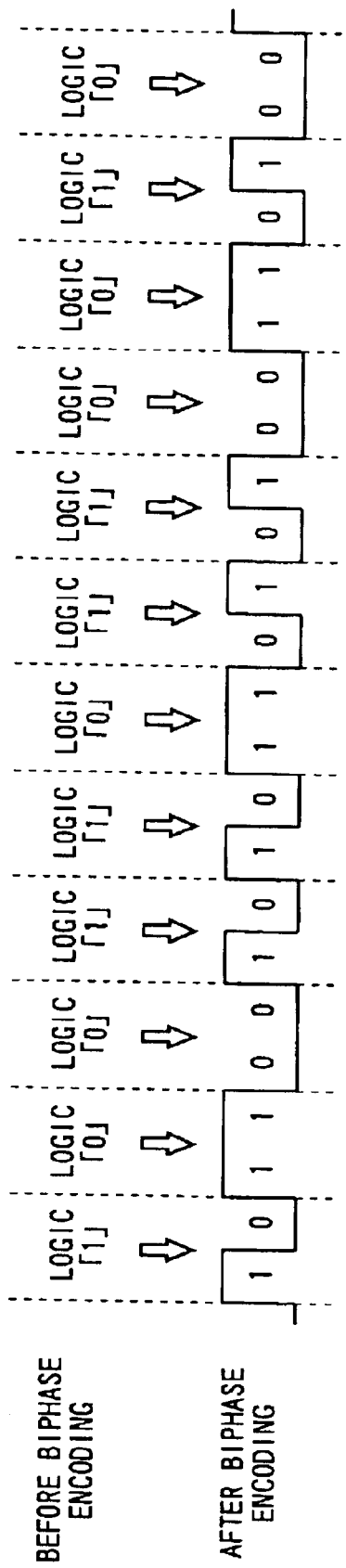
FIG. 6 is an illustration for describing biphase encoding.

Also, as illustrated in FIG. 4, the code of the biphase-encoded data is always reversed in the timing which corresponds to the boundaries between the bits of the data portion before biphase encoding. In view of this, in the other scheme, the timing detector 130 detects a portion of two successive identical codes as illustrated in FIG. 5. Since the boundary of the detected two bits does not correspond to the boundary between the bits of the data portion before biphase encoding, it is possible to detect the timing which corresponds to the boundaries between the bits of the data portion before biphase encoding. This scheme is particularly effective for transmission of data having no header portion (biphase-encoded data, for example).

Based on the detection result of the timing detector 130, the selector 140 selects either one of the first and second parallel data output from the S/P converter 120. More specifically, of the first and second parallel data, the one converted from serial to parallel in the timing which corresponds to the boundaries between the bits of the data portion before biphase encoding is selected.

Figure 12:
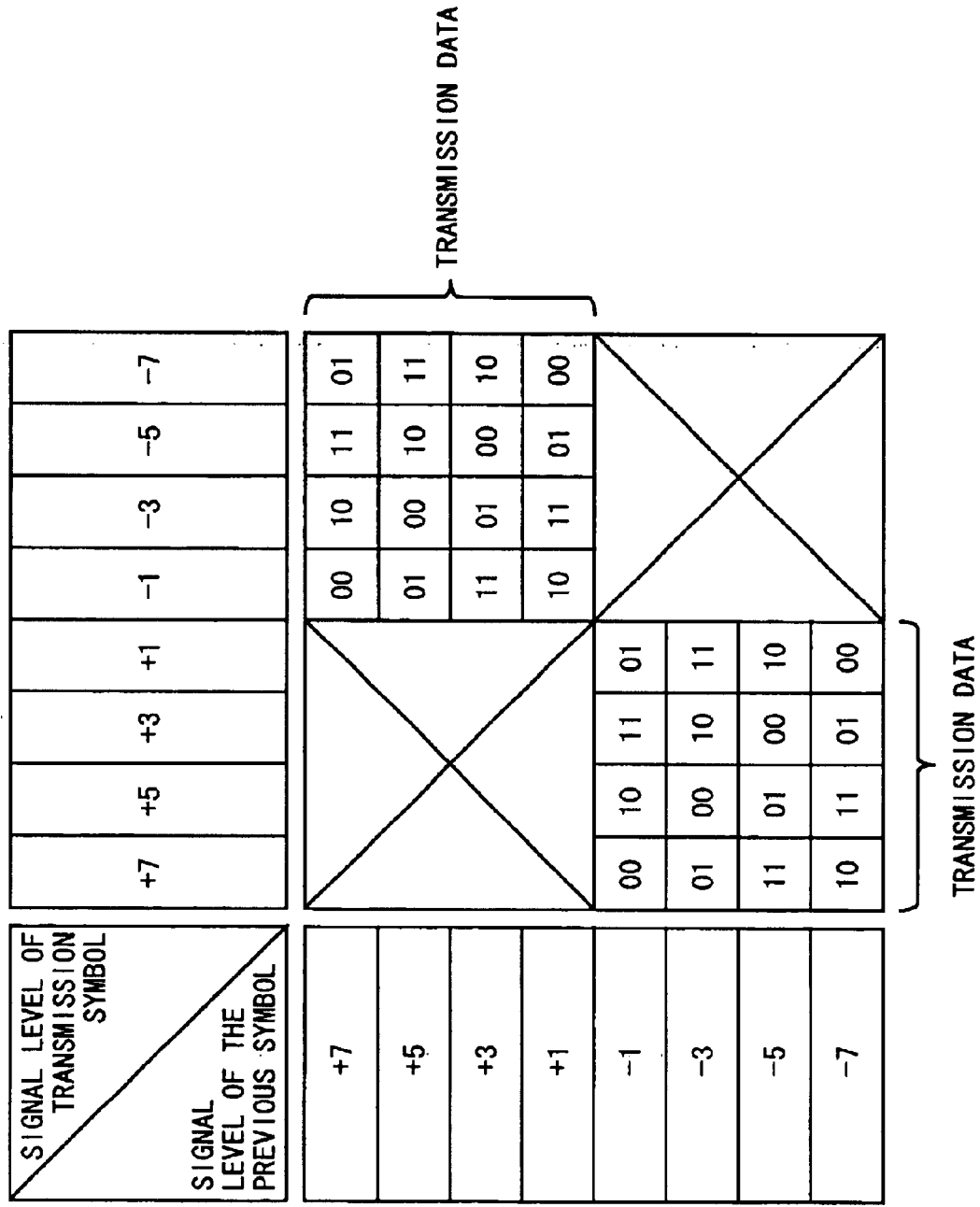
FIG. 12 is another illustration for describing the mapping operation performed by the encoder in the conventional communication system.
Figure 13:
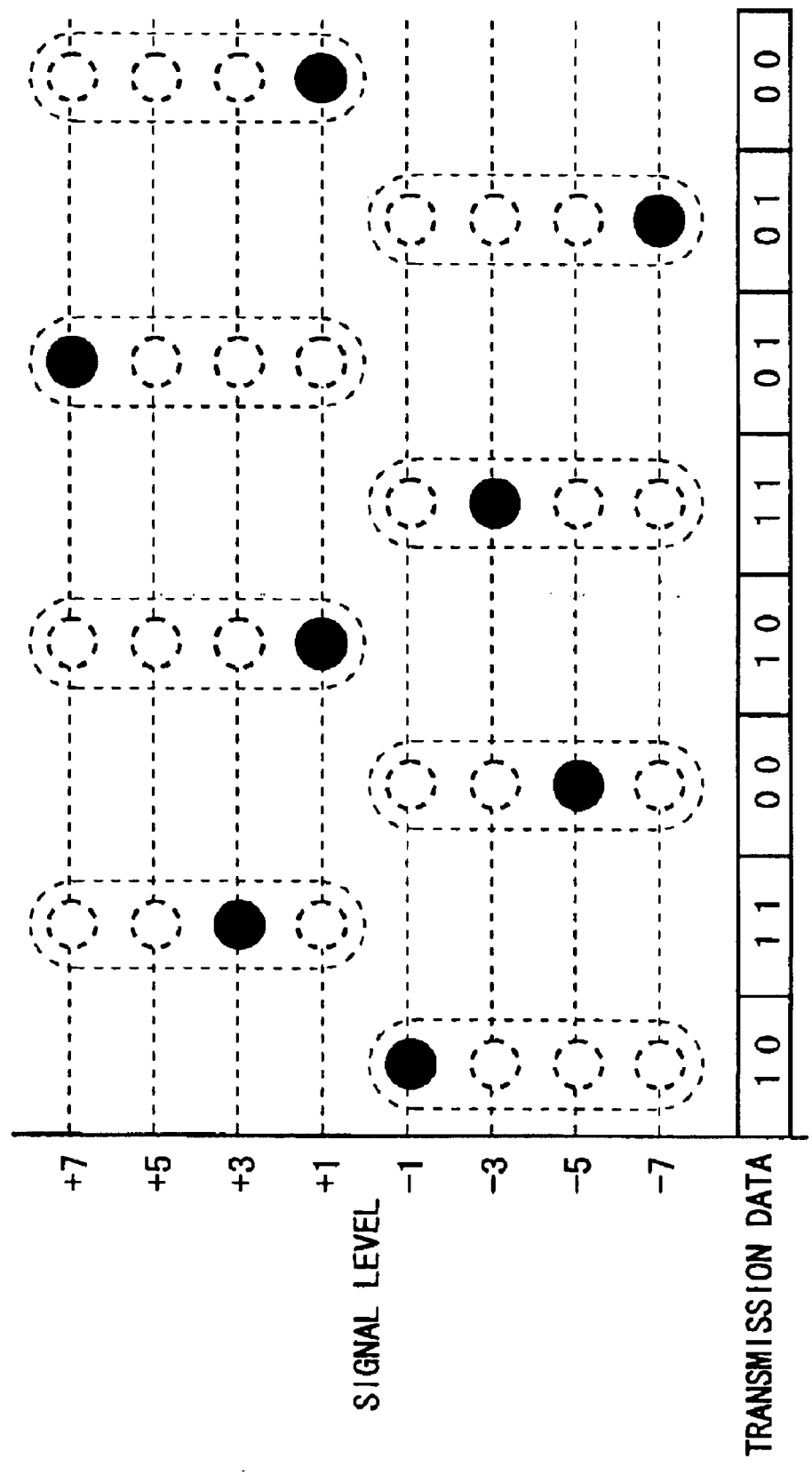
FIG. 13 is an illustration showing one example of an output of the encoder in the conventional communication system.
Figure 14:
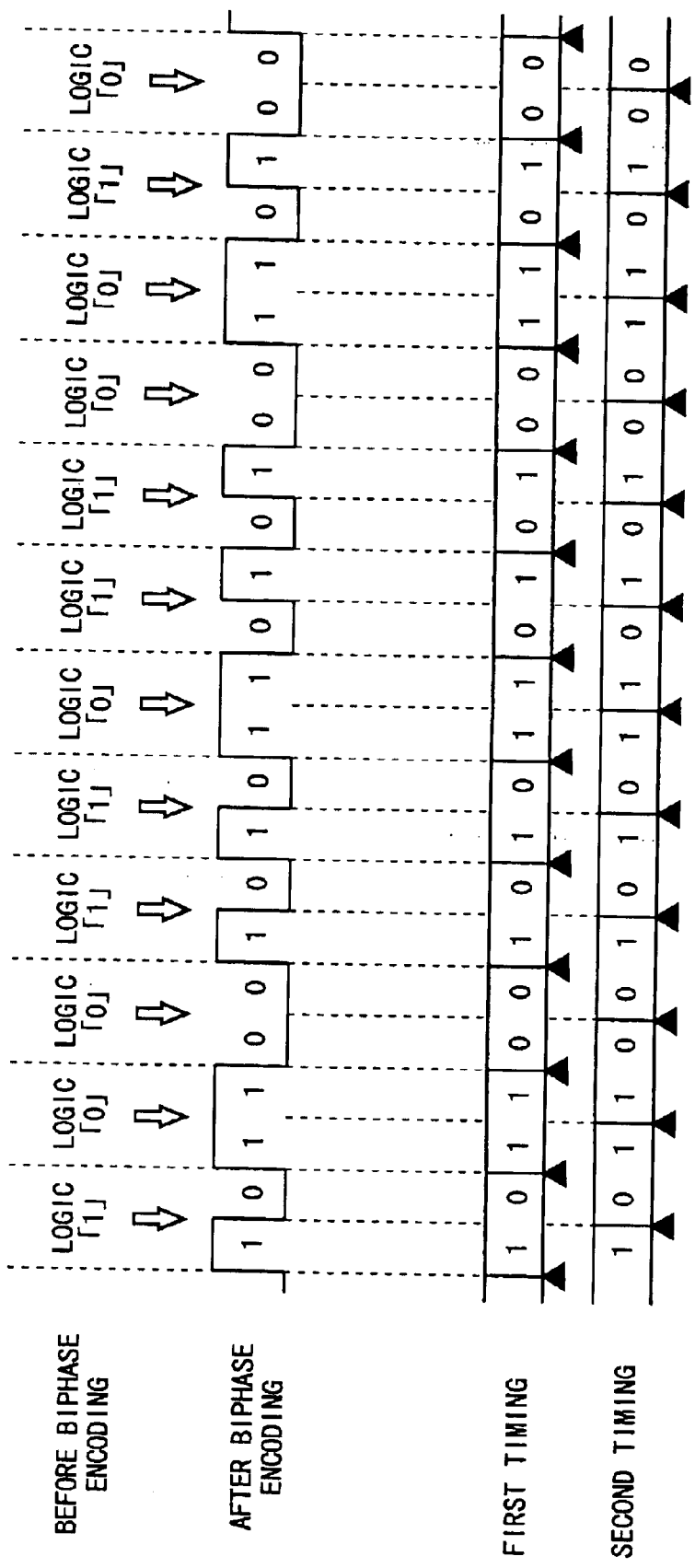
FIG. 14 is an illustration showing timings for serial-parallel conversion in the conventional communication system.
Figure 15:
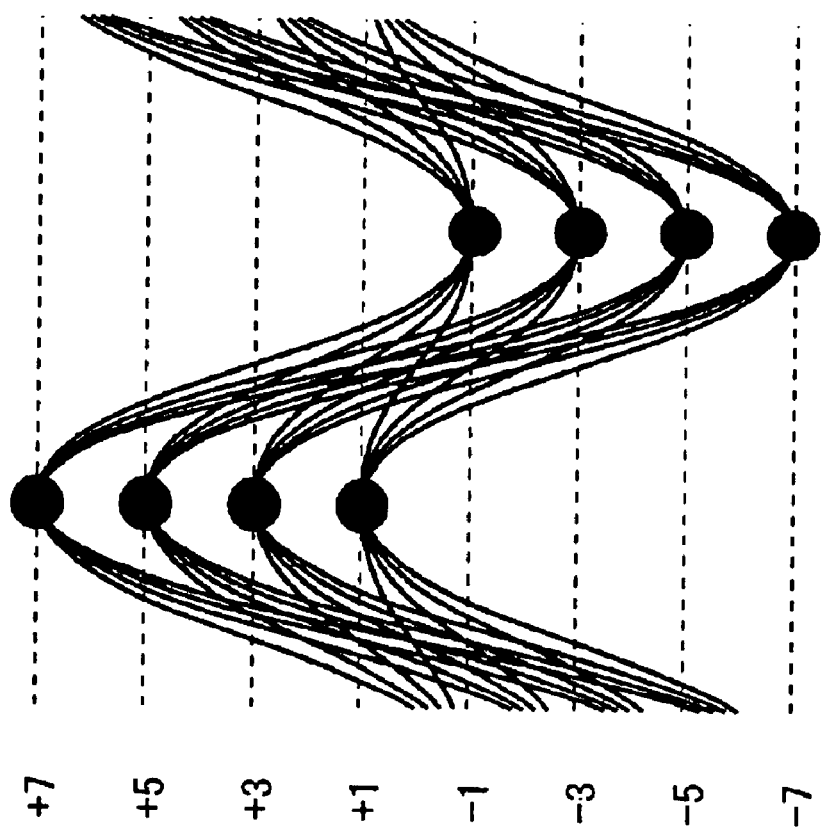
FIG. 15 is an illustration showing a transmission waveform when serial-parallel conversion is performed at a first timing shown in FIG. 14.

Consequently, after the selected parallel data is mapped by the encoder 106 based on the rules shown in FIG. 12, the transmission waveform of an analog signal eventually sent from the communication device 12 is as illustrated in FIG. 15. Therefore, a state in which the signal level is alternately changed between +7 and −7 as illustrated in FIG. 16B can be prevented.

Particularly, when the data before biphase encoding has successive 0s, "00" and "11" are alternately output from the selector 140. Therefore, even when the data is mapped in accordance with the rules shown in FIG. 12, the state in which the signal level is alternately changed between +7 and −7 can be prevented.

Figure 16A:
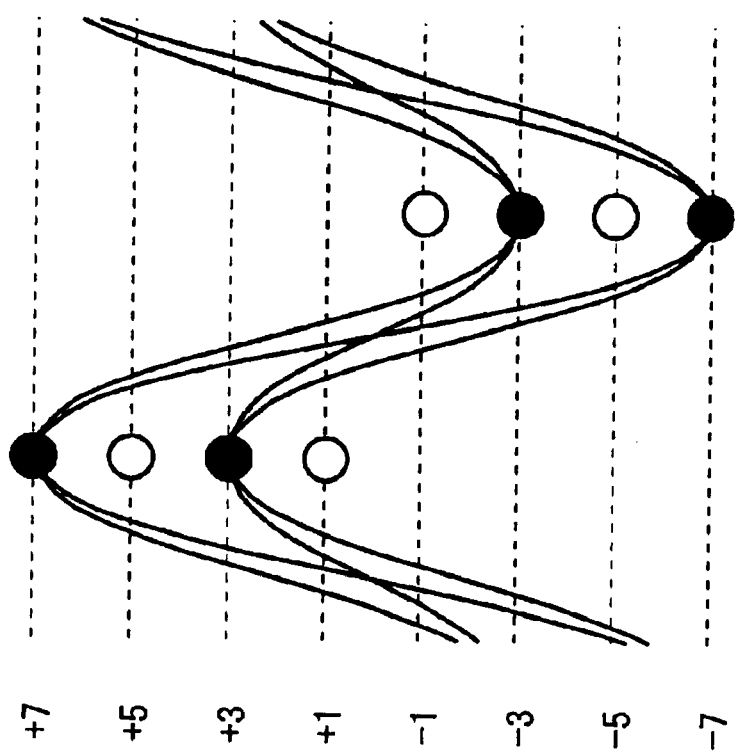
FIGS. 16A and 16B are illustrations showing transmission waveforms when serial-parallel conversion is performed at a second timing shown in FIG. 14.
Figure 16B:
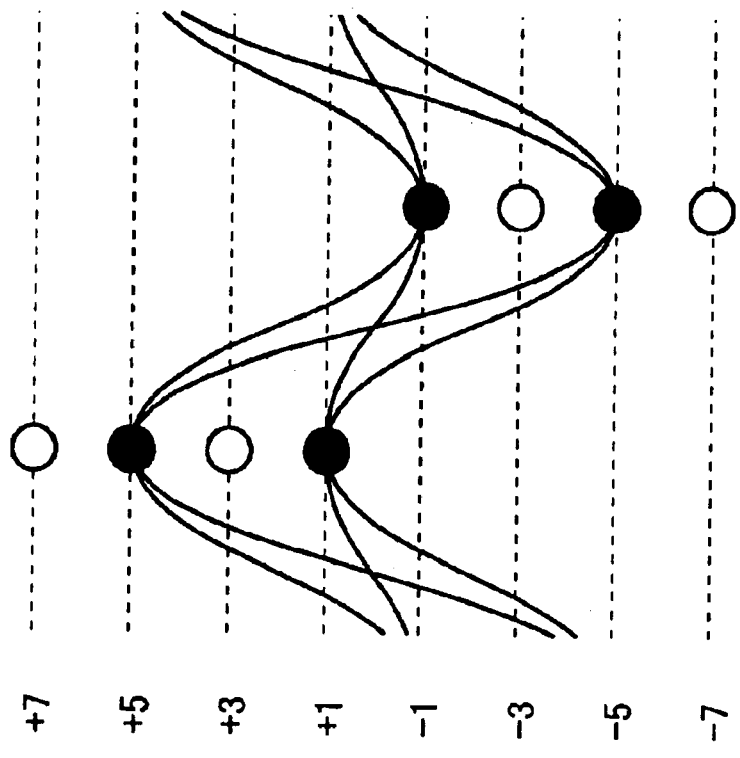

As described above, according to the present embodiment, the state in which the signal level is alternately changed between +7 and −7 as illustrated in FIG. 16B can be prevented. Therefore, the amount of emission noise can be stabilized.

In the present embodiment, either one of the first and second parallel data output from the S/P converter 120 is selected by the selector 140 based on the detection result of the timing detector 130. The present invention is not restricted to this. That is, the present invention can be applied to a case in which the selector 140 is not provided and the S/P converter 120 converts the input data 102 to parallel data based on the detection result of the timing detector 130.

Furthermore, mapping is performed by the encoder 106 in accordance with the rules shown in FIG. 12. The present invention is not restricted to this but can be applied to a case in which mapping is performed so that every bit pattern of the transmission symbol has a one-to-one correspondence with the signal level.

Still further, in the present embodiment, the case of transmitting the input data 102 structured of S/PDIF frames has been described. The present invention is not restricted to this, but can be generally applied to a case of transmitting serial data having at least a biphase-encoded data portion.

Still further, the present invention can be applied irrespectively of whether the serial data to be transmitted has a header portion or not. When serial data having a header portion is transmitted by utilizing the present invention, the number of bits of this header portion is preferably an even number. This is because, in the present invention, serial data is converted from serial to parallel for every two bits and, therefore, if the number of bits of the header portion is an odd number, an appropriate timing for serial-parallel conversion has to be changed for each frame. In other words, an appropriate timing for serial-parallel conversion of a data portion of one frame is not appropriate for serial-parallel conversion of a data portion of another frame coming next. By contrast., if the number of bits of the header portion is an even number, once an appropriate timing for serial-parallel conversion is established, serial-parallel conversion thereafter can always be performed at that appropriate timing without requiring any change in timing.

Needless to say, the above also applies to a case in which the serial data to be transmitted is structured only of a biphase-encoded data portion. That is, also in this case, once an appropriate timing for serial-parallel conversion is established, serial-parallel conversion thereafter can always be performed at that appropriate timing without requiring any change in timing.

Figure 9:
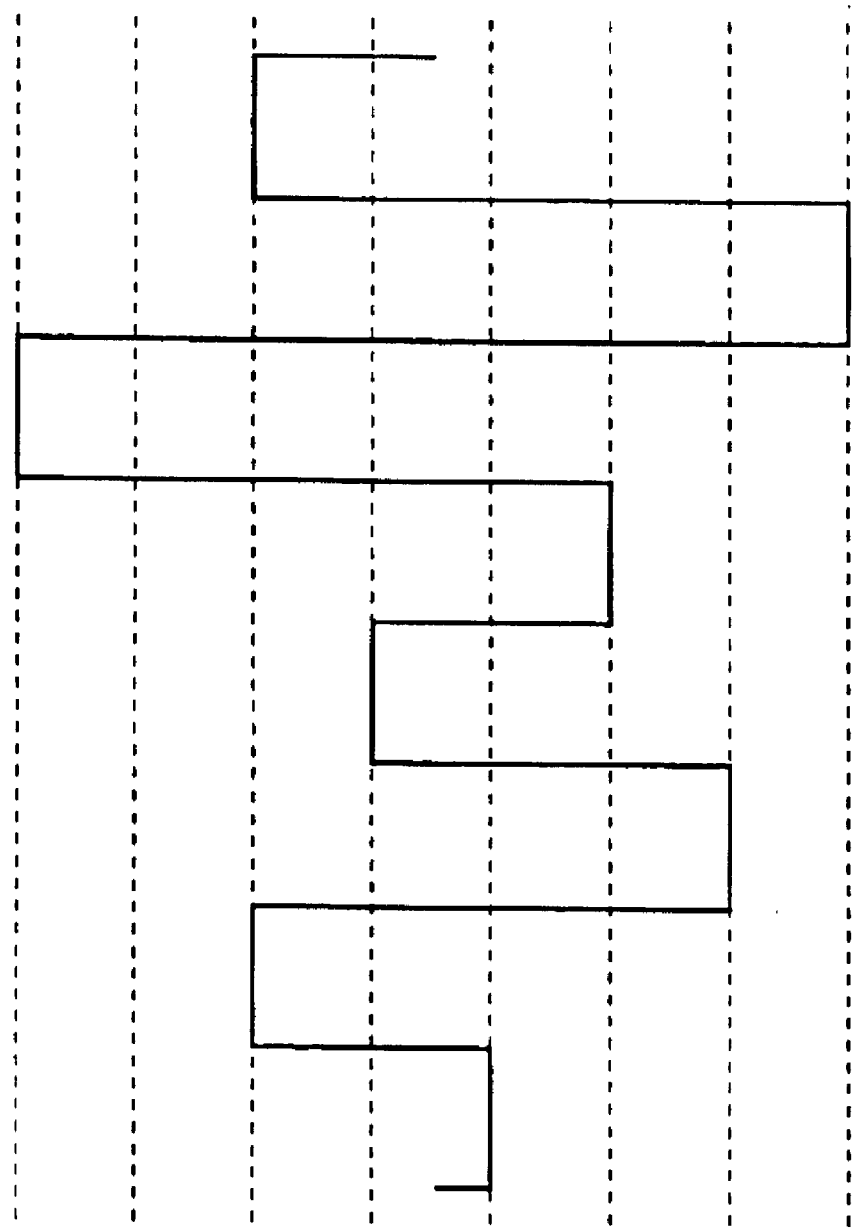
FIG. 9 is an illustration showing an example of a waveform of a signal input to a differential driver 114.

Still further, in the present embodiment, the digital filter 108 and the low-pass filter 112 are provided so that the D/A converter 110 is sandwiched therebetween as illustrated in FIG. 1. However, these filters can be omitted. In this case, the waveform of the signal input to the differential driver 114 is not as smooth as that illustrated in FIG. 15, but is stepwise as illustrated in FIG. 9.

While the invention has been described in detail, the foregoing description is in all aspects illustrative and not restrictive. It is understood that numerous other modifications and variations can be devised without departing from the scope of the invention.

What is claimed is:

1. A communication device for transmitting input data including at least a biphase-encoded data portion, comprising:
   a timing detector for detecting, based on the input data, a timing which corresponds to a boundary between bits of the data portion before biphase encoding;
   an S/P converter for converting, based on the detection result of the timing detector, the input data from serial data to parallel data for every two bits;
   a mapping unit for sequentially mapping the parallel data output from the S/P converter at any one of a plurality of signal levels; and
   a D/A converter for outputting an analog signal based on the mapping result of the mapping unit.

2. The communication device according to claim 1, wherein
   the input data has a header portion inserted therein, and
   the timing detector detects the timing by detecting the header portion in the input data.

3. The communication device according to claim 2, wherein
   the number of bits of the header portion is an even number.

4. The communication device according to claim 1, wherein
   the timing detector detects the timing by detecting a portion of two successive identical codes in the input data.

5. The communication device according to claim 1, wherein
   the input data is structured of MOST frames.

6. A communication device for transmitting input data including at least a biphase-encoded data portion, comprising:
   an S/P converter for converting the input data from serial data to parallel data for every two bits in different timings and outputting two types of parallel data:
   a timing detector for detecting, based on the input data, a timing which corresponds to a boundary between bits of the data portion before biphase encoding;
   a selector for selecting based on the detection result of the timing detector, one of the two types of parallel data output from the S/P converter;
   a mapping unit for sequentially mapping every two bits of the parallel data selected by the selector at any one of a plurality of signal levels; and
   a D/A converter for outputting an analog signal based on the mapping result of the mapping unit.

7. The communication device according to claim 6, wherein
   the input data has a header portion inserted therein, and
   the timing detector detects the timing by detecting the header portion in the input data.

8. The communication device according to claim 7, wherein
   the number of bits of the header portion is an even number.

9. The communication device according to claim 6, wherein
   the timing detector detects the timing by detecting a portion of two successive identical codes in the input data.

10. The communication device according to claim 6, wherein
    the input data is structured of MOST frames.

11. The communication device according to claim 6, wherein
    of the two types of parallel data output from the S/P converter, the selector selects parallel data obtained through serial-parallel conversion in the timing which corresponds to the boundary between the bits of the data portion before biphase encoding.

12. The communication device according to claim 11, wherein
    the input data has a header portion inserted therein, and
    the timing detector detects the timing by detecting the header portion in the input data.

13. The communication device according to claim 12, wherein
    the number of bits of the header portion is an even number.

14. The communication device according to claim 11, wherein
    the timing detector detects the timing by detecting a portion of two successive identical codes in the input data.

15. The communication device according to claim 11, wherein
    the input data is structured of MOST frames.

* * * * *